United States Patent
Goto et al.

[11] Patent Number: 6,134,700
[45] Date of Patent: Oct. 17, 2000

[54] LEADFRAME TIP ARRANGEMENT DESIGNING METHOD

[75] Inventors: Akihiro Goto; Hirokazu Taki; Yoshiharu Takahashi; Yasuhito Suzuki, all of Tokyo; Takao Takahashi, Hyogo; Takashi Arita, Hyogo; Satoshi Ookyuu, Hyogo, all of Japan

[73] Assignee: Mitsubishi Denki Kabushiki Kaisha, Tokyo, Japan

[21] Appl. No.: 09/044,786

[22] Filed: Mar. 20, 1998

[30] Foreign Application Priority Data

Jul. 3, 1997 [JP] Japan ................................. 9-178234

[51] Int. Cl.$^7$ ................................................ G06F 17/50
[52] U.S. Cl. ................ 716/1; 716/19; 257/672; 257/673; 257/666; 438/123; 438/121
[58] Field of Search ................ 395/500.02; 438/111, 438/123, 121; 716/1, 19; 257/666, 672, 673

[56] References Cited

U.S. PATENT DOCUMENTS

| | | | |
|---|---|---|---|
| 5,442,230 | 8/1995 | Chillara et al. | 257/666 |
| 5,594,626 | 1/1997 | Rostoker et al. | 361/784 |
| 5,902,119 | 5/1999 | Taki et al. | 438/111 |

*Primary Examiner*—Paul R. Lintz
*Assistant Examiner*—Vuthe Siek
*Attorney, Agent, or Firm*—Burns, Doane, Swecker & Mathis, LLP

[57] ABSTRACT

First, a reference point on a die pad and a leadframe tip arrangement line are set. A plurality of isosceles triangles having the same base length are set so that their apices are located at the reference point. A given number of isosceles triangles are arranged inside the leadframe tip arrangement line by adjusting the base length. The base length of the isosceles triangles is employed as a uniform lead pitch, and a uniform lead width is then determined. The base length of the isosceles triangles is calculated by using the successive bisection algorithm.

7 Claims, 4 Drawing Sheets

LEADFRAME TIP ARRANGEMENT DESIGNING METHOD

This application is based on Japanese Patent Application No. Hei 9-178234, filed on Jul. 3, 1997, which is incorporated by reference herein in its entirety.

BACKGROUND OF THE INVENTION

1. Field of the Invention

The present invention relates to a designing method of leadframe tip arrangement and, more specifically, to a designing method for arranging leadframe tips at a constant lead pitch.

2. Background Art

First, an example of a conventional designing method of leadframe tip arrangement will be described.

FIGS. 5 and 6 show a conventional designing method of leadframe tip arrangement. More specifically, FIG. 5 shows a ¼ model of a leadframe tip arrangement diagram and FIG. 6 shows a definition of lead pitches.

In FIGS. 5 and 6, reference numeral 1 denotes a die pad outline, numeral 2 denotes a chip outline, numeral 3 denotes a reference point, numeral 4 denotes a leadframe tip arrangement line, numeral 5 denotes an end point of the leadframe tip arrangement line 4, numeral 6 denotes the other end point of the leadframe tip arrangement line 4, and numerals 7–16 denote leadframe tip portions.

In FIG. 6, reference numerals 19 and 20 denote leadframe tip pitches (i.e., lead pitches), and numeral 23 denotes a leadframe tip width (i.e., lead width). Reference numeral 25 denotes the central axis of a leadframe tip portion 7, and numeral 26 denotes an angle formed by the leadframe tip arrangement line 4 and the central axis 25. Further, in FIG. 5, reference numeral 30 denotes a die pad corner portion.

In this conventional method, the lead pitches 19 and 20 (see FIG. 6) are defined so as to equally divide the segment between the end points 5 and 6 of the leadframe tip arrangement line 4 (see FIG. 5). This causes a problem that the angle 26 (see FIG. 6) decreases and the lead width 23 becomes smaller as the leadframe tip portion comes closer to the die pad corner portion 30.

As described above, in the conventional designing method of leadframe tip arrangement, a leadframe tip arrangement line is equally divided and each divisional length is defined as a lead pitch. This results in the problems that leadframe tip portions in a die pad corner portion have smaller widths than those in a die pad central portion and that lead pitches and lead widths become not uniform. Further, the fact that lead widths become small may be disadvantageous to wire bonding due to limitations of the wire bonder.

SUMMARY OF THE INVENTION

The present invention has been made to solve the above problems in the conventional art, and therefore an object of the present invention is to provide a method for effectively designing leadframe tips having uniform lead pitches and uniform lead widths.

According to one aspect of the present invention, in a designing method of leadframe tip arrangement, a reference point is set on a die pad, and a leadframe tip arrangement line is set opposite to the die pad. A plurality of isosceles triangles are set so that respective apices are located at the reference point, and each of the respective bases has one point that is located on the leadframe tip arrangement line, and further the respective bases have the same length. A given number of isosceles triangles are arranged inside the leadframe tip arrangement line by adjusting the length of the bases of the isosceles triangles. Further, a plurality of leadframe tips are arranged along the bases of the respective isosceles triangles.

In another aspect of the present invention, in the designing method of leadframe tip arrangement, in the step of arranging the given number of isosceles triangles, respective apex angles at the reference point of the given number of isosceles triangles are calculated. Then, a sum of the apex angles is calculated. Further, the length of the bases is adjusted so that the sum of the apex angles of the given number of isosceles triangles becomes equal to an angle subtended by the leadframe tip arrangement line.

In another aspect of the present invention, in the designing method of leadframe tip arrangement, in the step of arranging the given number of isosceles triangles, an upper limit and a lower limit of the length of the bases are set. Then, the length of the bases are adjusted by calculating the length using a successive bisection algorithm based on the upper limit and the lower limit.

Other features and advantages of the invention will be apparent from the following description taken in connection with the accompanying drawings.

DETAILED DESCRIPTION OF THE INVENTION

Figure 1:
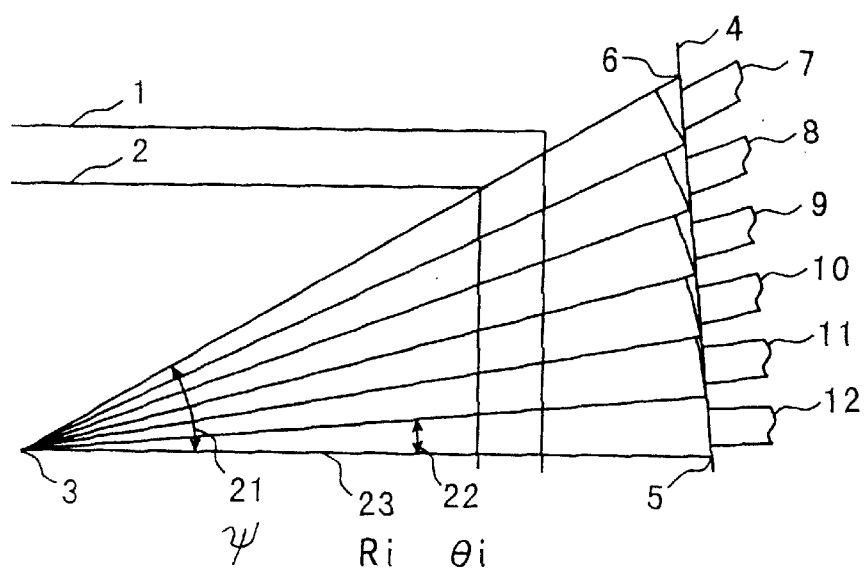
FIG. 1 is a diagram of leadframe tip arrangement showing a designing method of leadframe tip arrangement according to a first embodiment of the present invention.

An embodiment of the present invention will be hereinafter described with reference to the accompanying drawings. The same reference numerals in the drawings denote the same or equivalent parts.

Figure 2:
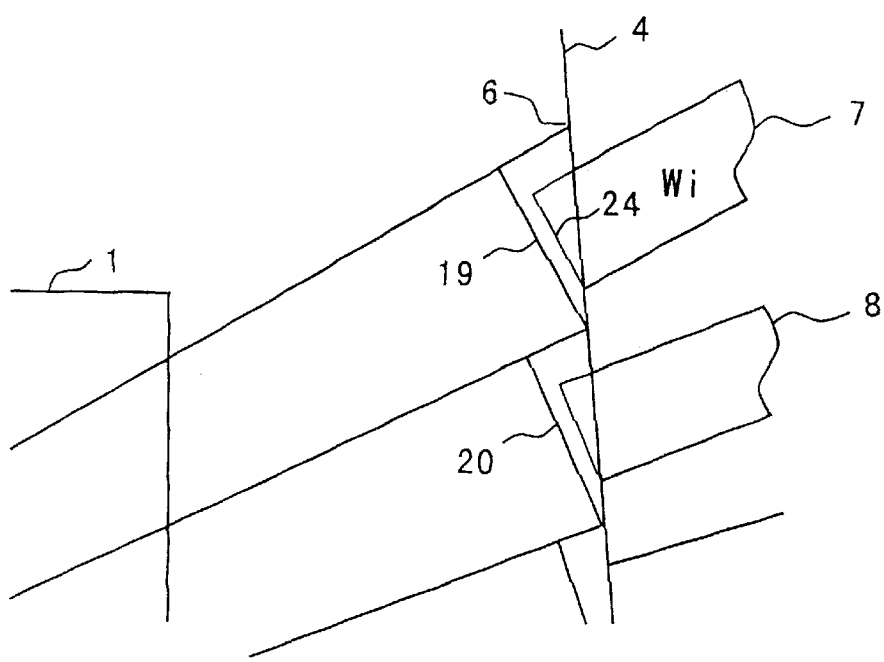
FIG. 2 is a partial enlarged diagram of FIG. 1.

FIGS. 1–4 show a designing method of leadframe tip arrangement according to an embodiment of the present invention. FIG. 1 is a diagram of ¼ model of a leadframe tip arrangement in accordance with an equal division scheme of leadframe tip pitches. FIG. 2 is a partial enlarged diagram of FIG. 1 and shows and illustrates lead pitches.

In FIGS. 1 and 2, reference numeral 1 denotes a die pad outline, numeral 2 denotes a chip outline, numeral 3 denotes a reference point on the die pad, reference numeral 4 denotes a leadframe tip arrangement line, numerals 5 and 6 denote the respective end points of the leadframe tip arrangement line 4, numerals 7–12 denote leadframe tip portions, numerals 19 and 20 denote leadframe tip pitches (i.e., lead pitches), numeral 21 denotes a leadframe tip arrangement angle $\psi$ numeral 22 denotes a lead pitch angle $\theta_i$, numeral 23 denotes a side length of an isosceles triangle, and numeral 24 denotes a leadframe tip width (i.e., lead width) $W_i$.

As shown in FIGS. 1 and 2, in the designing method of leadframe tip arrangement of this embodiment, the reference point 3 is set inside the die pad outline 1, and the leadframe tip arrangement line 4 on which leadframe tips are to be arranged is set so as to be opposed to the die pad outline 1. With the reference point 3 employed as the common apex, a given number of isosceles triangles having the same base length are arranged so that one point on each base is located on the leadframe tip arrangement line 4. Uniform lead pitches are set by defining the base length of the isosceles triangles as a lead pitch. Leadframe tips having uniform lead widths are arranged in the respective uniform lead pitches.

Next, design steps of the above designing method of leadframe tip arrangement will be described.

Figure 3:
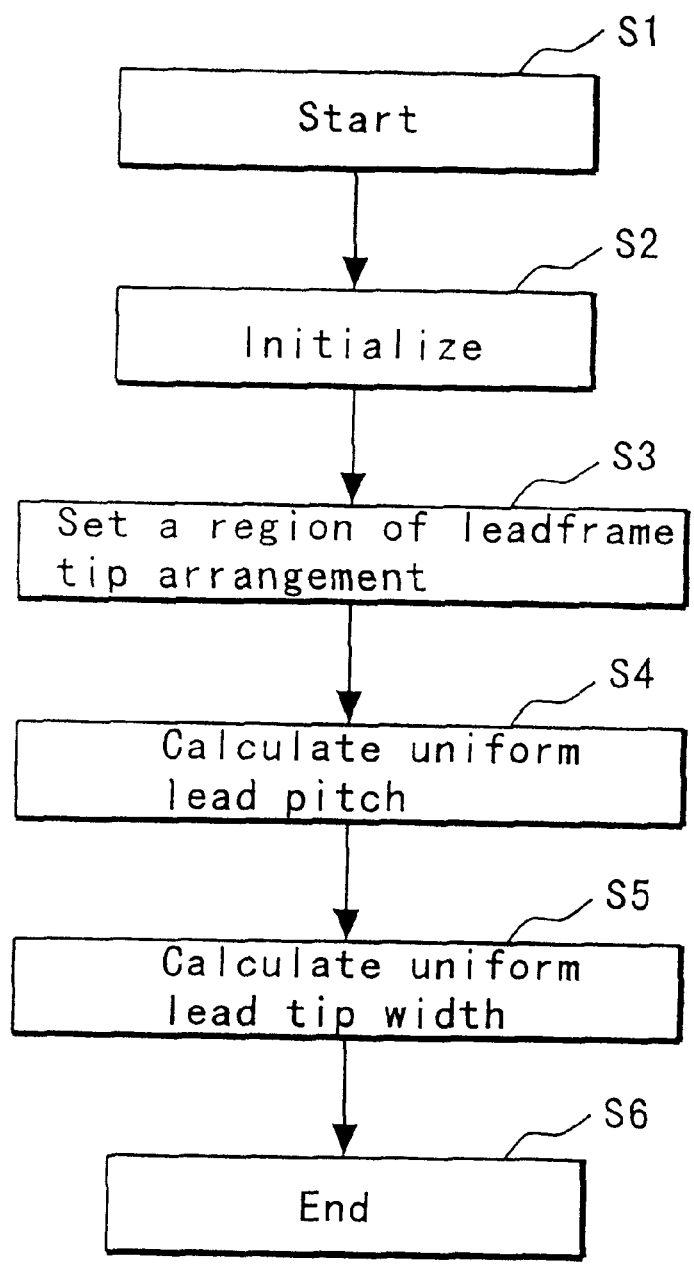
FIG. 3 is a flowchart for practicing the designing method of leadframe tip arrangement according to the first embodiment of the invention.
Figure 4:
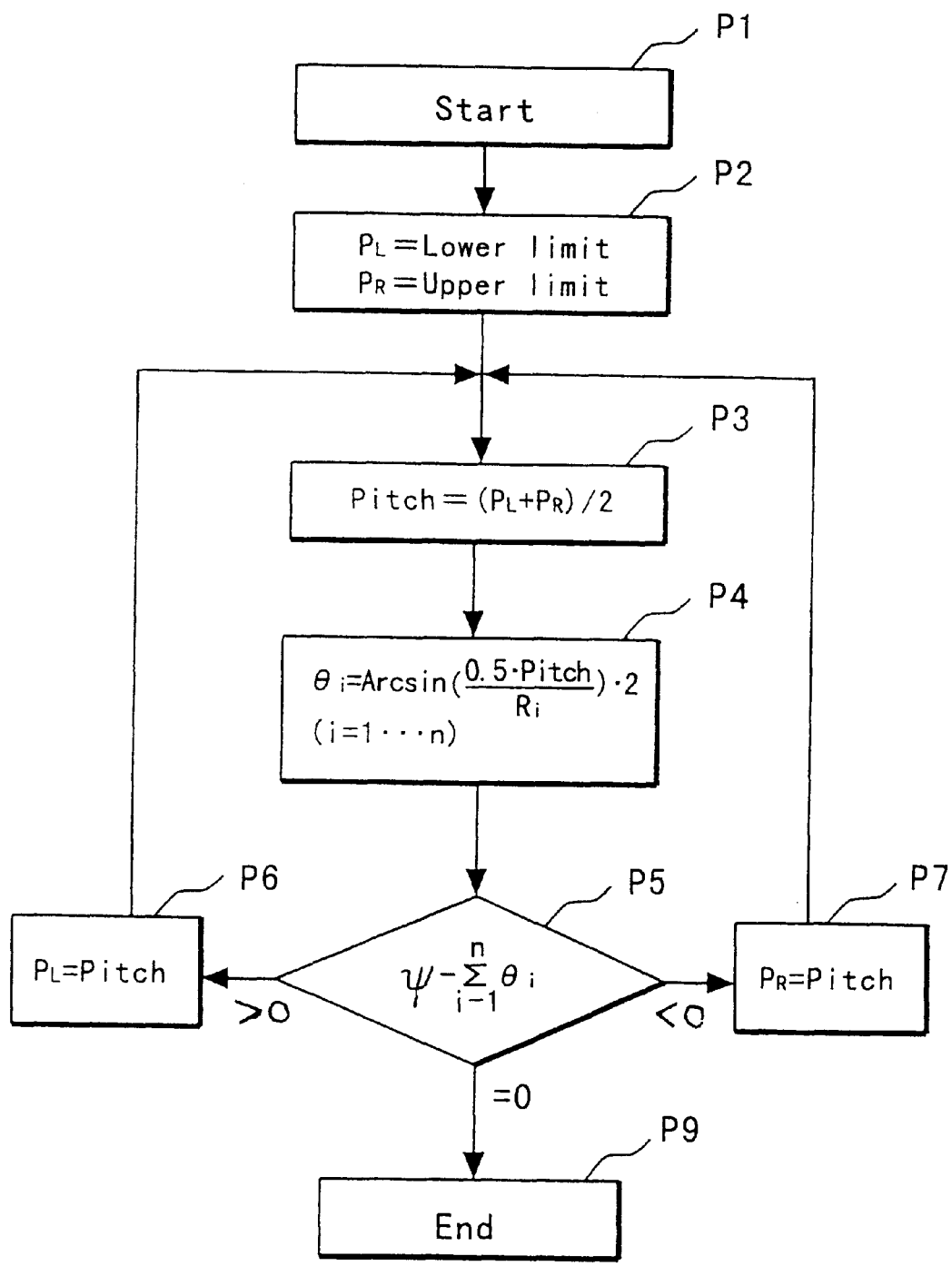
FIG. 4 is a flowchart showing a calculation method of uniform lead pitch according to the first embodiment of the invention.
Figure 5:
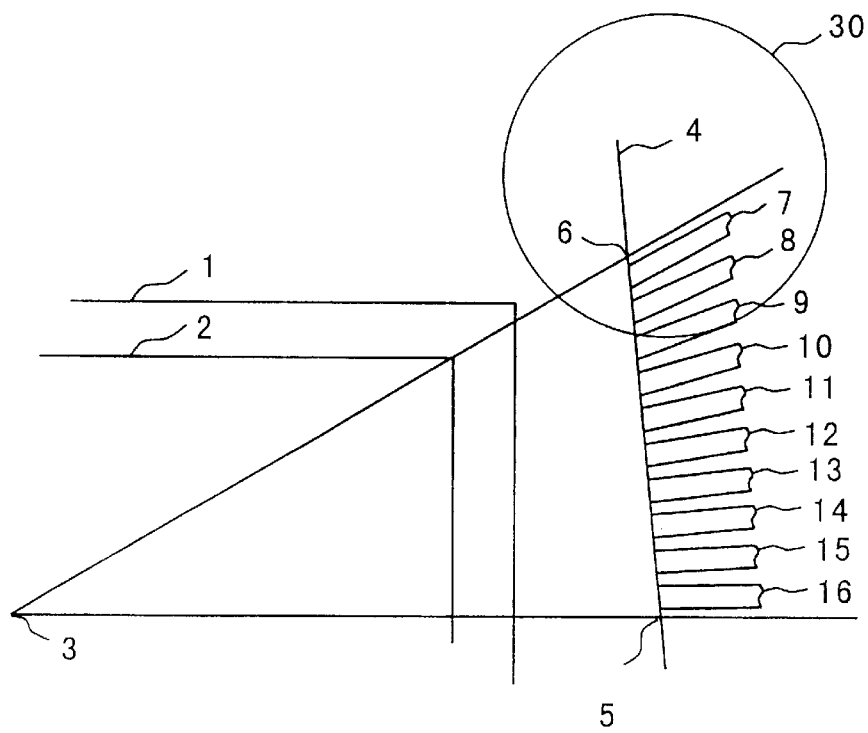
FIG. 5 is a diagram of leadframe tip arrangement according to an example of a conventional method.
Figure 6:
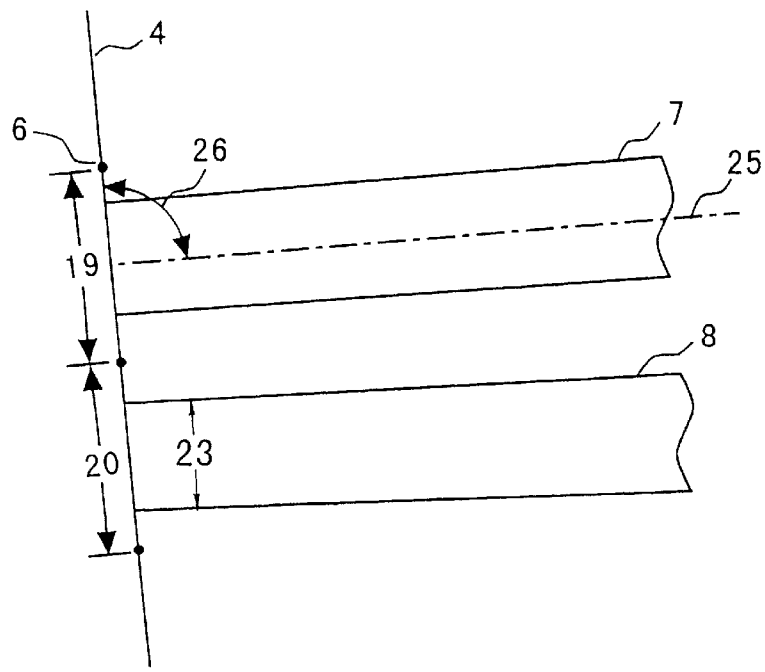
FIG. 6 shows lead pitches in the conventional method of FIG. 5.

FIGS. 3 and 4 are flowcharts for arranging leadframe tips according to the equal division scheme of leadframe tip pitches. In FIG. 3, symbol S1 denotes a step which starts the process, S2 denotes an initialization step, S3 denotes a setting step of leadframe tip arrangement region, S4 denotes a step of uniform lead pitch calculation, S5 denotes a step of uniform lead tip width calculation, and S6 denotes a step which ends the process. FIG. 4 shows details of step S4 of FIG. 3.

The respective design steps will be described below. Referring to FIG. 3, the uniform lead pitch calculation process is started at step S1 and the number of lead tips to be arranged in a leadframe tip arrangement region, i.e., a divisional number n, is set at step S2.

At step S3, a leadframe tip arrangement region is set by using the reference point 3 in the manner shown in FIG. 1. Thus, the reference point 3, the leadframe tip arrangement line 4, and its end points 5 and 6 are set.

At step S4, a uniform lead pitch calculation for setting uniform lead pitches is performed. Fundamental formulae for the uniform lead pitch calculation are the following nonlinear equations (1-1) and (1-2). A uniform lead pitch can be determined by solving Equations (1-1) and (1-2) for the lead pitch.

$$\psi - \sum_{i=1}^{n} \theta_i = 0 \qquad \text{(Equation 1-1)}$$

$$\theta_i = \text{Arcsin}((0.5 \cdot \text{Pitch})/R_i) \cdot 2 \qquad \text{(Equation 1-2)}$$

where i=1, 2, ..., n

In Equations (1-1) and (1-2), $\psi$ is the angle 21 of the leadframe tip arrangement region that has the reference point 3 as the apex and $\theta_i$ is the apex angle 22 of each isosceles triangle (see FIG. 1). The parameter Pitch is the lead pitch 19 or 20 (see FIG. 2), and $R_i$ is the side length 23 of each isosceles triangle (see FIG. 1). Further, n is the number of leads.

FIG. 4 shows details of step S4 in FIG. 3, that is, a flowchart of the uniform lead pitch calculation. Referring to FIG. 4, a description will be made of a uniform lead pitch calculation method in which the successive bisection algorithm is applied to Equations (1-1) and (1-2).

The uniform lead pitch calculation is started at step P1 in FIG. 4. At step P2, a lead pitch lower limit $P_L$ and upper limit $P_R$ are set to define a range where a solution of Equation (1-1) should exist. For example, the lower limit $P_L$ is set at 0.0 and the upper limit $P_R$ is set at the length of the leadframe tip arrangement line 4 (distance between the end points 5 and 6).

At step P3, the average of the lower limit $P_L$ and the upper limit $P_R$ is calculated as a lead pitch value according to Equation (2).

$$\text{Pitch} = (P_L + P_R)/2 \qquad \text{(Equation 2)}$$

At step P4, the lead pitch angle $\theta_i$ of each isosceles triangle (see FIG. 1) is calculated according to Equation (1-2). The distance between the reference point 3 and the end point 5, for instance, is set as an initial value of $R_i$ which is the side length of each isosceles triangle.

At step P5, a judgment is made by using Equation (1-1) as a judgment formula. If the left side of Equation (1-1) is negative (i.e., $\psi < \Sigma \theta_i$), at step P7 the lead pitch upper limit $P_R$ is determined according to Equation (3-2). If the left side of Equation (1-1) is positive (i.e., $\psi < \Sigma \theta_i$), at step P6 the lead pitch lower limit $P_L$ is determined according to Equation (3-1).

$$P_L = \text{Pitch} \qquad \text{(Equation 3-1)}$$

$$P_R = \text{Pitch} \qquad \text{(Equation 3-2)}$$

In either case, the process returns to step P3 to iterate steps P3–P5. If the left side of Equation (1-1) is zero (i.e., $\psi = \Sigma \theta_i$), the process escapes from the iteration and goes to step P9.

Since step P9 is the end of the uniform lead pitch calculation, the process goes to step S5 in FIG. 3.

At step S5 in FIG. 3, a uniform leadframe tip width wi is calculated according to Equation (4).

$$W_i = \text{Pitch} \cdot \alpha \qquad \text{(Equation 4)}$$

(i=1, 2, ..., n; 0<$\alpha$<1)

In Equation (4), the uniform leadframe tip width $W_i$ is the leadframe tip width 24 (see FIGS. 1 and 2). The coefficient $\alpha$, which is for determining the leadframe tip width $W_i$ based on the lead pitch Pitch, can be set at an arbitrary positive value that is smaller than 1.0. The parameter n is the number of leads.

Step S6 is a termination step. At this time, the division for arranging the given number of leadframe tips between the end points 5 and 6 (see FIG. 1) at the uniform lead pitch is completed, and the uniform leadframe tip width 24 ($W_i$) is determined.

The invention also pertains to the leadframe tip arrangement produced by the method described above.

The design computations shown in FIGS. 3 and 4 can be performed automatically, e.g., by using a general purpose computer, as will be apparent to those skilled in the art.

Although, in the above embodiment, the successive bisection algorithm is used to numerically solving the nonlinear equations, other numerical solving methods such as the Newton-Raphson algorithm may be used.

Although, in the above embodiment, the coefficient $\alpha$ is set at a value smaller than 1.0, it may be set first by selecting a value from the interval of 0 to 1.0 and, if no solution is obtained, it may be set (changed) individually or automatically by searching this interval.

As described above, according to the above embodiment, an arrangement of leadframe tips having a uniform lead pitch and a uniform lead width can be designed effectively.

Since the physical characteristics such as the electric resistance and the thermal resistance are uniform in leads having a uniform lead pitch and a uniform leadframe tip width, such leads contribute to stabilization of the characteristics of a semiconductor device.

As described above, in the present invention, leadframe tips having a uniform lead pitch and a uniform lead width are designed by first setting a reference point, then arranging isosceles triangles having the same base length, and finally employing the base length as a lead pitch. Therefore, the invention provides a method capable of effectively designing an arrangement of leadframe tips having a uniform lead pitch and a uniform lead width.

In the present invention, respective apex angles, at a reference point, of a given number of isosceles triangles are calculated and the base length of the isosceles triangles is adjusted so that the sum of the apex angles becomes equal to a specified angle. Therefore, the invention provides a method capable of effectively designing an arrangement of leadframe tips having a uniform lead pitch and a uniform lead width.

Further, because of the use of the successive bisection algorithm for the uniform lead pitch calculation, the invention enables correct, numerical setting of a lead pitch as well as setting of a uniform leadframe tip width.

Obviously many modifications and variations of the present invention are possible in the light of the above teachings. It is therefore to be understood that, within the scope of the appended claims, the invention may by practiced otherwise than as specifically described.

What is claimed is:

1. A designing method of leadframe tip arrangement comprising the steps of:

setting a reference point on a die pad and a leadframe tip arrangement line;

arranging a given number of isosceles triangles inside the leadframe tip arrangement line by adjusting the length of bases of the isosceles triangles, wherein said isosceles triangles are set so that respective apices of the triangles are located at the reference point, and so that each of the respective bases has one point that is located on the leadframe tip arrangement line, and so that the respective bases have the same length; and arranging leadframe tips along the bases of the respective isosceles triangles.

2. The designing method of leadframe tip arrangement according to claim 1, wherein said step of arranging the given number of isosceles triangles comprises the substeps of:

calculating respective apex angles, at the reference point, of the given number of isosceles triangles;

calculating a sum of the apex angles; and adjusting the length of the bases so that the sum of the apex angles of the given number of isosceles triangles becomes equal to an angle subtended by the leadframe tip arrangement line.

3. The designing method of leadframe tip arrangement according to claim 2, wherein said step of arranging the given number of isosceles triangles further comprises the substeps of:

setting an upper limit and a lower limit of the length of the bases; and adjusting the length of the bases by calculating the length using a successive bisection algorithm based on the upper limit and the lower limit.

4. The designing method of leadframe tip arrangement according to claim 1, wherein said leadframe tips have a uniform width.

5. An arrangement of leadframe tips produced by the designing method of claim 1.

6. A designing method of leadframe tip arrangement according to claim 1, wherein adjacent ones of the isosceles triangles have sides positioned along a common line.

7. A designing method of leadframe tip arrangement according to claim 1, wherein each of said leadframe tips is arranged to be oriented perpendicular to a corresponding one of said bases of the isosceles triangles.

* * * * *